United States Patent [19]

von Gnechten et al.

[11] Patent Number: 5,367,701
[45] Date of Patent: Nov. 22, 1994

[54] PARTITIONABLE DATA PROCESSING SYSTEM MAINTAINING ACCESS TO ALL MAINSTORAGE UNITS AFTER BEING PARTITIONED

[75] Inventors: Mark von Gnechten, Fremont; Brian T. Chase, San Jose; Richard J. Tobias, Santa Rosa; David Dooley, San Jose, all of Calif.

[73] Assignee: Amdahl Corporation, Sunnyvale, Calif.

[21] Appl. No.: 994,122

[22] Filed: Dec. 21, 1992

[51] Int. Cl.⁵ .............................................. G06F 13/00
[52] U.S. Cl. ..................................... 395/800; 395/425; 364/299.5; 364/245.5; 364/245.6; 364/246; 364/246.9; 364/DIG. 1
[58] Field of Search ............... 395/800, 425, 200, 325; 364/DIG. 1, DIG. 2, 229.5, 245.5, 245.6, 246, 246.9

[56] References Cited

U.S. PATENT DOCUMENTS

| | | | |
|---|---|---|---|
| 4,293,910 | 10/1981 | Flusche et al. | 395/425 |
| 4,654,778 | 3/1987 | Chiesa et al. | 395/425 |
| 4,905,141 | 2/1990 | Brenza | 395/425 |
| 5,023,776 | 6/1991 | Gregor | 395/425 |
| 5,214,769 | 5/1993 | Uchida et al. | 395/425 |

*Primary Examiner*—Alyssa H. Bowler
*Assistant Examiner*—Dzung C. Nguyen
*Attorney, Agent, or Firm*—Fliesler, Dubb, Meyer & Lovejoy

[57] ABSTRACT

A partitionable computing system includes main storage units on respective sides of the complex which can be fully controlled and accessible from either side. The system includes a dual port main storage unit design, and a system controller design capable of driving plural main storage unit interfaces. With this configuration, one system controller and the processors attached to that system controller can be taken offline and partitioned off to perform maintenance while all of the physical main storage units remain accessible to the processors on the surviving side of the complex. The operating system sees no loss available memory and the time to perform the maintenance activity is significantly reduced.

7 Claims, 6 Drawing Sheets

| IBUS CYCLE | 0 | 1 | 2 | 3 | 4 | 5 |
|---|---|---|---|---|---|---|
| SIDE0-IBUS0 | | | | | | |
| D0 REQ BUFFER | X | | | | | |
| D1 LATCH | | X | | | | |
| D2 LATCH | | | X | | | |
| D3 LATCH | | | | X | | |
| D4 LATCH | | | | | X | |
| D3' LATCH | | | | | | |
| D4' LATCH | | | | | | |
| SC0 RQ PORT | | | | | | X |
| SC0 XC PORT | | | | | | - |
| IBUS GRANT | | | | | | G |
| DIEC BUSY | | | | | | D |
| MSEL BUSY | | | | | | M |

| IBUS CYCLE | 0 | 1 | 2 | 3 | 4 | 5 |
|---|---|---|---|---|---|---|
| SIDE1-IBUS1 | | | | | | |
| D0 REQ BUFFER | | | | | | |
| D1 LATCH | | | | | | |
| D2 LATCH | | | | | | |
| D3 LATCH | | | | | | |
| D4 LATCH | | | | | | |
| D3' LATCH | | | | X | | |
| D4' LATCH | | | | | X | |
| SC1 RQ PORT | | | | | | - |
| SC1 XC PORT | | | | | | X |
| IBUS GRANT | | | | | | - |
| DIEC BUSY | | | | | | D |
| MSEL BUSY | | | | | | M |
| IBUS CYCLE | 0 | 1 | 2 | 3 | 4 | 5 |

FIG.—5

| IBUS CYCLE | 0 | 1 | 2 | 3 | 4 | 5 |
|---|---|---|---|---|---|---|
| SIDE0-IBUS0 | | | | | | |
| D0 REQ BUFFER | X | | | | | |
| D1 LATCH | | X | | | | |
| D2 LATCH | | | X | | | |
| D3 LATCH | | | | X | | |
| D4 LATCH | | | | | X | |
| D3' LATCH | | | | Y | | |
| D4' LATCH | | | | | Y | |
| SC0 RQ PORT | | | | | | – |
| SC0 XC PORT | | | | | | Y |
| IBUS GRANT | | | | | | – |
| DIEC BUSY | | | | | | D |
| MSEL BUSY | | | | | | M |

| IBUS CYCLE | 0 | 1 | 2 | 3 | 4 | 5 |
|---|---|---|---|---|---|---|
| SIDE1-IBUS1 | | | | | | |
| D0 REQ BUFFER | Y | | | | | |
| D1 LATCH | | Y | | | | |
| D2 LATCH | | | Y | | | |
| D3 LATCH | | | | Y | | |
| D4 LATCH | | | | | Y | |
| D3' LATCH | | | | X | | |
| D4' LATCH | | | | | X | |
| SC1 RQ PORT | | | | | | Y |
| SC1 XC PORT | | | | | | – |
| IBUS GRANT | | | | | | G |
| DIEC BUSY | | | | | | D |
| MSEL BUSY | | | | | | M |

FIG.–6

PARTITIONABLE DATA PROCESSING SYSTEM MAINTAINING ACCESS TO ALL MAINSTORAGE UNITS AFTER BEING PARTITIONED

BACKGROUND OF THE INVENTION

1. Field of the Invention

The present invention relates to large scale data processing systems which include multiple CPUs and main storage units, and more particularly to the problem of preserving the availability and contents of the main storage units when the system is partitioned for maintenance activities.

2. Description of Related Art

Current computing complexes which can be partitioned are built with a plurality of "sides", each side physically containing a set of computing resources, such as CPUs, I/O processors, main storage units, cache memory systems, and other facilities interconnected through a system controller for the side. When joined, the system controllers on the plural sides communicate with each other to allow access to all of the physical main storage units as a single logical storage array from any processor in the complex. The connection between the system controllers can be broken and the systems partitioned into two independent systems to allow maintenance activity to be performed on one side of the complex, while the other side continues to operate. In current art, the main storage units of the system are also involved in the partitioning, such that the memory on the side of the complex affected by maintenance activity is unavailable to the surviving side.

The partitioning of the main storage units has two detrimental effects. First, the main storage units which will be partitioned away from the system must be taken offline to the operating system. Depending on what applications are running, this can be a very time consuming process. Second, the loss of memory creates an additional performance loss to the surviving system on top of the loss of processor power.

Accordingly, it is desirable to provide a system in which all of the memory can be kept available to the operating system, even after the system has been partitioned into two physical systems in order to isolate units of the system for maintenance.

SUMMARY OF THE INVENTION

The present invention provides a partitionable computing system in which the main storage units on respective sides of the complex can be fully controlled and accessible from either side. The system includes a dual port main storage unit design, and a system controller design capable of driving plural main storage unit interfaces. With this configuration, one system controller and the processors attached to that system controller can be taken offline and partitioned off to perform maintenance while all of the physical main storage units remain accessible to the processors on the surviving side of the complex. The operating system sees no loss of available memory and the time to perform the maintenance activity is significantly reduced.

Accordingly, the present invention can be characterized as a data processing system which comprises a first mainstore having a local and remote port and a second mainstore having a local and remote port. A first set of computing resources generates requests for access to both the first and second mainstores. Similarly, a second set of computing resources generates a request for accesses to the first and second mainstores. First and second system controllers are coupled with respective sets of computing resources and each other. Both the first and second system controllers include input means which receives requests for access to data from the first and second mainstores and server means which services the requests with resources in the system controller. A service processor is included in the complex for partitioning the first system controller and the first set of computer resources from the second system controller and the second set of resources when necessary for maintenance activity and the like.

Each system controller includes data integrity servers which maintain information about data in cache memories in the set of computing resources coupled to the system controller. This data is used for insuring system data integrity in response to accesses from both the first set of computing resources and through the other system controller, the second set of computing resources. Thus, the system controllers also include an interface which transfers requests for access from the set of computing resources coupled to the local system controller, to the remote system controller for service by the data integrity servers in the remote system controller. In this manner, when both systems are operating, the system controllers in the complex cooperate to insure data integrity. After partitioning, because the main storage servers in the respective system controllers are able to read and write mainstore independently, the surviving side of the complex is able to use the entire memory space. Data integrity operations in the partitioned system controller are unnecessary because the set of computing resources coupled to the partitioned system controller are offline.

The systems also include logic which prevent collisions between separate accesses to particular elements of the main storage units in the system. Thus, the main storage systems include in one aspect a plurality of elements which can be accessed in parallel. If two accesses to a single element of the mainstore are issued at the same time by the two system controllers, logic in the system controllers detect that condition and provide an arbitration service to prevent collisions.

Accordingly, a large scale computing system is provided having capability of partitioning a system controller associated with a main storage unit and a set of computing resources from the system, while maintaining access to the main storage unit associated with the partitioned system controller for all other computing resources in the complex. This allows for isolation of a set of computing resources and a system controller for the purpose of maintenance activity while other system controllers and processing resources in the complex retain access to all of the mainstore.

Other aspects and advantages of the present invention can be seen upon review of the figures, the detailed description, and the claims which follow.

DESCRIPTION OF THE PREFERRED EMBODIMENTS

Figure 1:
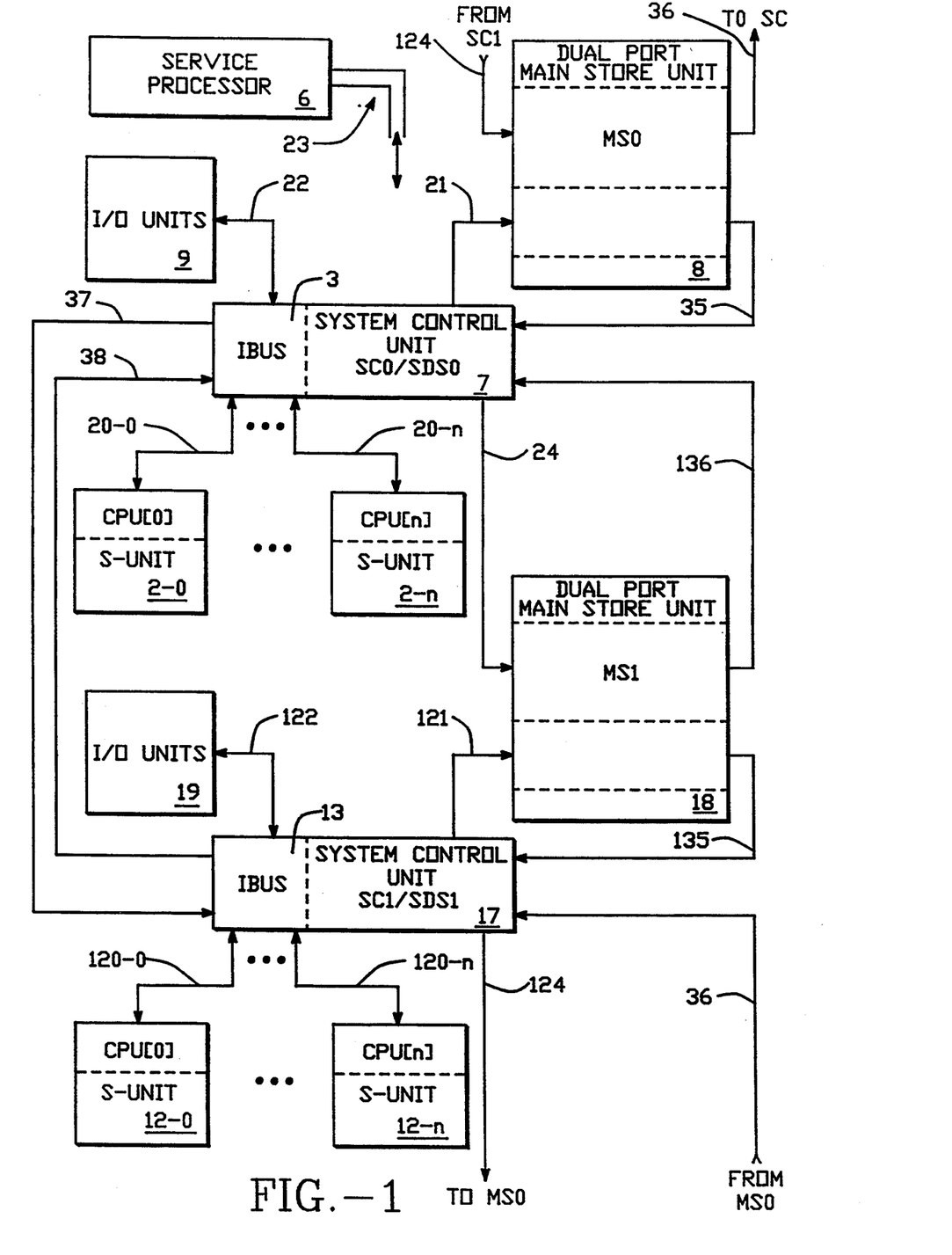
FIG. 1 is a block diagram of a large scale computing complex according to the present invention.

A detailed description of preferred embodiments of the present invention is provided with respect to the figures. FIG. 1 provides a system block diagram. FIGS. 2–6 illustrate a preferred embodiment of the system controller and main storage unit according to the present invention.

SYSTEM OVERVIEW (FIG. 1)

FIG. 1 illustrates a large scale computing complex according to the present invention. The complex includes two "sides". A first side includes a plurality of central processing units (CPU[0] through CPU[n]) with accompanying storage units which provide cache memory services to the accompanying CPU. The CPUs in the plurality given the reference numbers 2-0 through 2-n. The CPUs on the first side are coupled across lines 20-0 through 20-n to a system control unit 7. System control unit 7 includes controller SC0, and a system data switch SDS0. Also, the system control unit 7 includes an input structure called the IBUS which receives requests for accesses to data from the plurality of CPUs 2-0 through 2-n. Also, the first side includes I/O units 9 which are coupled across line 22 to the IBUS 3. The first side also includes a dual port main storage unit 8 (MS0) which is coupled to the system control unit 7 across line 21.

The second side of the complex includes plurality of central processing units (CPU [0] through CPU [n]) with associated storage units including cache memories. These CPUs are given reference numbers 12-0 through 12-n. The plurality of CPUs on the second side is coupled to a system control unit 17 across lines 120-0 through 120-n. Also, I/O units 19 are coupled to the system control unit 17 across line 122. Lines 120-0 through 120-n and line 122 are coupled to the input structure 13 referred to as the IBUS of the system control unit 17. The system control unit 17 includes a system controller SC1 and system data switch SDS1.

A dual port main storage unit 18 (MS1) is coupled to the system control unit 17 across line 121. Output of the MS1 is supplied on line 135 to the system control unit 17. MS1 supplies output data on line 136 to the system control unit 7. Similarly, system control unit 7 is coupled on line 24 to the MS1 18. System control unit 17 is coupled across line 124 to the MS0. Thus, dual port main storage unit MS0 receives requests for access from system control unit 7 across line 21 and from system control unit 17 across line 124. Output data from the main storage unit MS0 is supplied on line 35 to system control unit 7 and on line 36 to system control unit 17.

The system control units 7 and 17 are cross coupled across lines 37 and 38. Thus, requests for accesses to data received by the input structure 3 on system control unit 7 are supplied on line 37 to the input structure 13 on system control unit 17. Requests for access to data received by the input structure 13 of system control unit 17 are supplied on line 38 to the input structure 3 of system control unit 7.

Through the cross coupling of the system control units and the main storage units, the central processing units in the complex have access to both main storage units MS0 and MS1 during normal operations. Requests for access to either main storage unit through computing resources coupled to a local system control unit must be cross coupled to the remote system control unit only for the purposes of insuring data integrity. The system control units include data integrity servers which maintain information about data maintained in the local CPUs storage units, which is used in the data integrity process. Thus, a local request for access to a main storage unit must be served by the data integrity logic in the remote system control unit to insure that the processing resources coupled to the remote system control unit do not have a copy of the data which can be affected by the request.

A service processor 6 is included in the complex which is coupled throughout the complex across lines 23 to provide service processor functions as known in the art. When the service processor needs to partition the complex in order to perform maintenance or other services, it disables the system control unit and the processing resources coupled to that system control unit. As part of the disabling of the system control unit, the data in the storage units is moved out if possible. Thus, after partitioning, accesses through the active system control unit to both mainstores have no need to review data integrity information in the remote, partitioned system controller. Thus, direct reads and writes on both the local and remote sides of the complex can be made independent of the partitioned system control unit.

Figure 2:
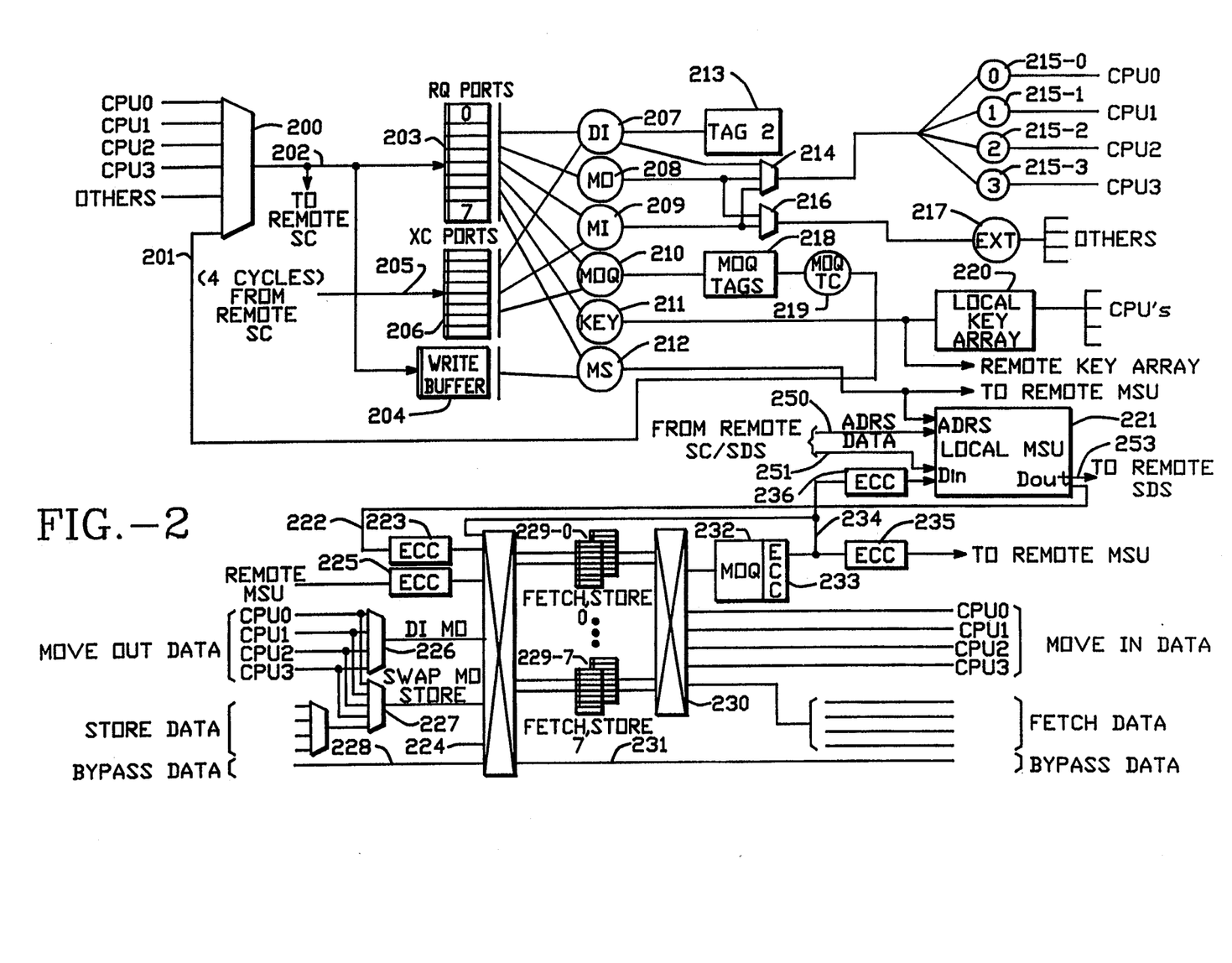
FIG. 2 is a logic diagram of a system controller for use in the system of FIG. 1.

SYSTEM CONTROL UNIT ARCHITECTURE (FIG. 2)

FIG. 2 illustrates a functional block diagram of the system controller according to the present invention. The system controller includes a system for controlling access to data among the CPUs and other portions of the system, such as the service processor, the main storage units, I/O processors, and the like. Thus, it includes an input priority logic 200 which receives requests from CPU 0 through CPU n (n=3 in the embodiment of FIG. 2). Other requestors to the system controller are also supplied as inputs to the priority logic 200, such as the service processor, I/O processors, and the like. Also, a move out queue bus 201 is supplied as an input to the priority logic 200. The output of the priority logic 200 is supplied on line 202 to the request ports 203 and to write buffers 204 including one buffer for the local mainstore and one for the remote mainstore. A remote system controller is also coupled through line 205 to cross coupled request ports 206.

The request ports 203 and 206 are coupled to a plurality of servers, including a data integrity server 207, a move out server 208, a move in server 209, a move out queue server 210, a key server 211, and a mainstore server 212. The remote system controller has access only to the data integrity server 207, move in server 209, and move out queue server 210. The write buffer 204 has access only to the mainstore server 212 and is dedicated for writes to the local and remote mainstores by the local computer resources.

The data integrity server 207 is coupled to the TAG2 logic 213. The TAG2 logic includes copies of the tags from all of the storage units for the local CPUs of the system. Thus, data integrity and cache consistency operations are carried out using the data integrity server 207 and the TAG2 logic 213. Requests for data accesses from the data integrity server 207, move out server 208, and move in server 209, are supplied through selector 214 to the interface controllers for each of the CPUs 215-0 through 215-3. Also, requests from move out server 208 and move in server 209 are supplied through selector 218 through interface controller 217 to other requestors in the system, such as service processors, I/O processors, and the like.

The move out queue server 210 is coupled to the move out queue tags 218 and the move out queue transfer controller 219. The output of the move out queue transfer controller 219 is supplied on line 201 to the select logic 200.

The key server 211 drives local key array 220 and a remote key array in the remote system controller. The local key array 220 is used to provide storage protection keys to the CPUs and other requestors in the system. The dual porting of the key array is logically handled in the same manner as the mainstore.

The mainstore server 212 supplies addresses to the local mainstore unit 221, and to a remote mainstore unit. The local mainstore unit 221 has address and data inputs on lines 250 and 251 respectively coupled to the remote system controller and remote system data switch, and a data output 253 coupled to the remote system data switch.

The system data switch SDS data paths for the system controller are shown in the bottom half of the figure. The output of the local mainstore unit is supplied on line 222 to ECC logic 223. The output of the ECC logic 223 is supplied to a switch 224. Other inputs to the switch 224 include the output of ECC logic 225 which is supplied from the remote mainstore unit, the output of the selector 226 which is used to supply data integrity move out data from the CPUs, and output of the selector 227 which is used to supply swap move out data from the CPUs in the system and store data from the various units in the system. Finally, the switch 224 receives bypass data for remote data integrity move outs across line 228. The output of the switch 224 supplied to the fetch and store buffers 229-0 through 229-7. The data in the fetch and store buffers is supplied through switch 230. The switch 224 also supplies bypass path 231 going to the remote SDS.

The output of the switch 230 supplies move out queue buffers 232 with associated ECC logic 233, the move in data paths to the respective CPUs, and the fetch data paths to the variety of fetch data requestors. The output of the move out queue ECC logic 233 is supplied on line 234 through error checking correcting logic 235 to the remote mainstore unit, and through ECC logic 236 to the local mainstore unit. Also, the data on line 234 is supplied as an input to the switch 224 for move out queue bypass.

DUAL PORT MAIN STORAGE UNIT (FIG. 2)

Figure 3:
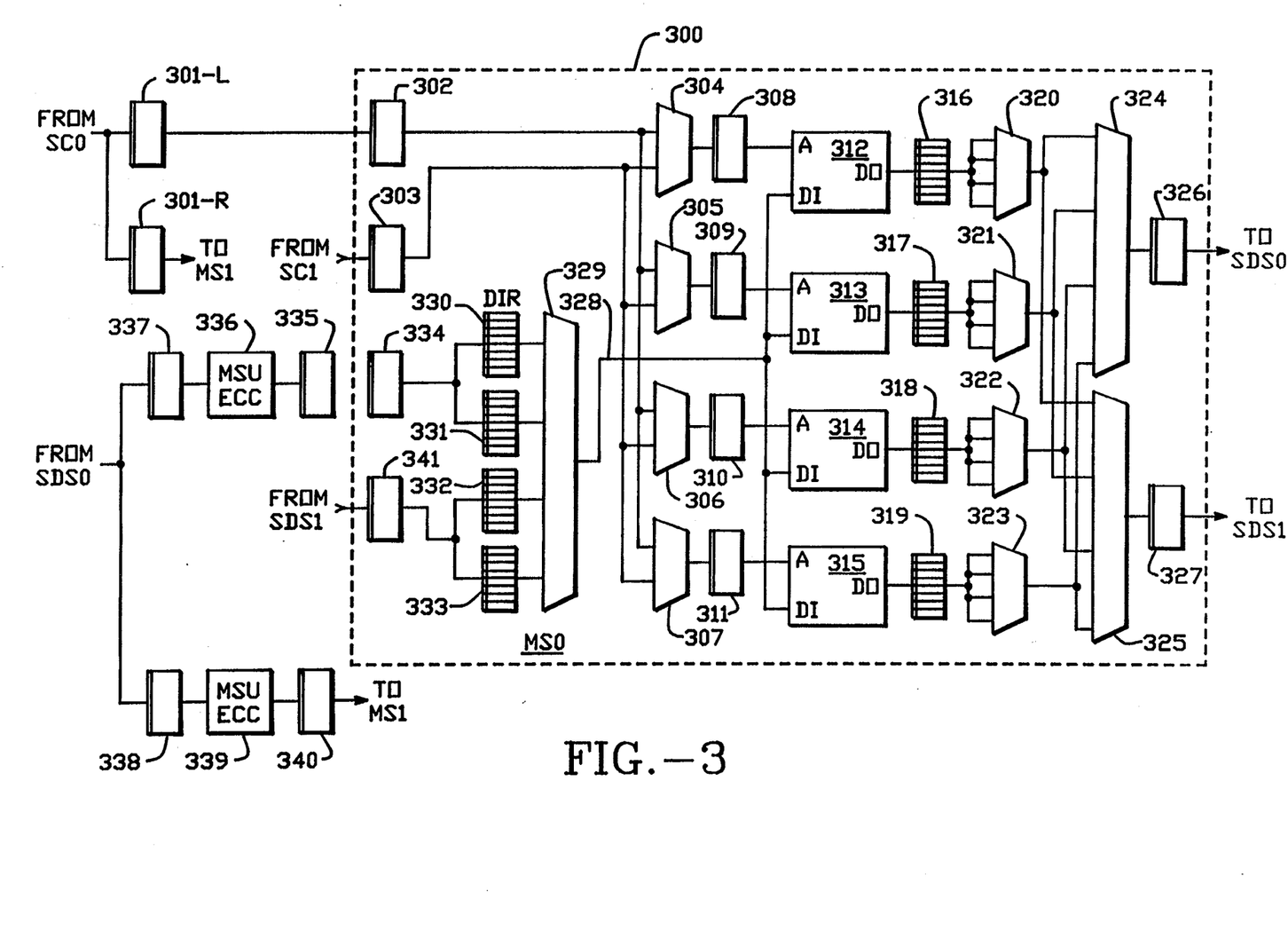
FIG. 3 is a logic diagram of a dual port main storage unit for use with the system of FIG. 1.

FIG. 3 provides a block diagram of a dual port main storage unit for use in the data processing complex of FIG. 1, having a first set of computing resources with a local system controller SC0 and a local system data switch SDS0, and a second set of computing resources with a remote system controller SC1 and a remote system data switch SDS1. FIG. 3 illustrates the local main storage unit MS0 generally 300. In the system, a remote main storage unit MS1 is included which has similar structure.

Requests for reads or writes to mainstore from the local system controller SC0 come in through latch 301.

The output of latch 301-L is supplied to the local main storage unit 300 at latch 302. The output of latch 301-R is supplied to the remote main storage unit MS1. Requests from the remote system controller SC1 are received at latch 303. The requests in latches 302 and 303 are supplied in parallel to selectors 304-307. Each of the selectors 304-307 supplies respective address latch 308-311. The address latches 308-311 supply address inputs to respective elements of the main storage system 312-315. Each of these elements is accessible in parallel.

For read accesses, the data is supplied out of the respective elements 312-315 to data out latches 316-319. The data in the data out latches consists of an entire line of data of 128 bytes. Thirty-two byte segments of the lines are supplied through selectors 320-323 to a local output selector 324 and a remote output selector 325. The output of the local output selector is supplied through latch 326 to the local system data switch. The output of the remote selector is supplied through latch 327 to the remote system data switch.

Input data for write operations is supplied to the data in ports on the mainstore elements 312-315 through bus 328. Bus 328 is supplied with data through selector 329 from local data in registers 330 and 331, and from remote data in registers 332 and 333. The registers are used in pairs for loading one while writing to mainstore with the other.

The local data in registers are supplied with data through latch 334, latch 335, error correcting logic 336, and latch 337, from the local system data switch. The local system data switch also supplies data to latch 338 through error correcting logic 339 and latch 340 to the remote SDS. Data from the remote SDS is supplied to the local main storage unit MS0 through latch 341 to the remote data in registers 332 and 333.

Figure 4:
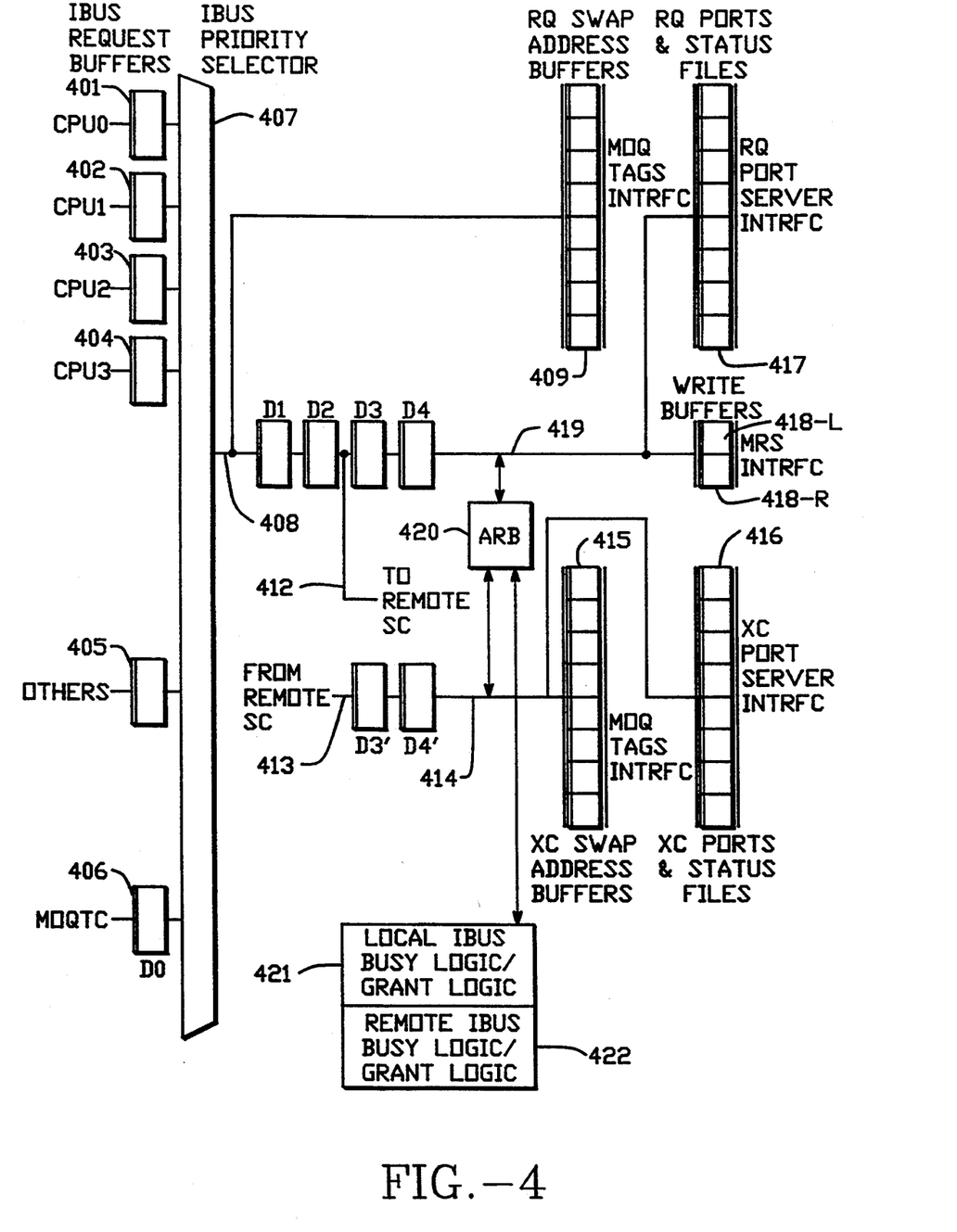
FIG. 4 is a schematic diagram of the input structure for the system controller of FIG. 2.
Figure 5:
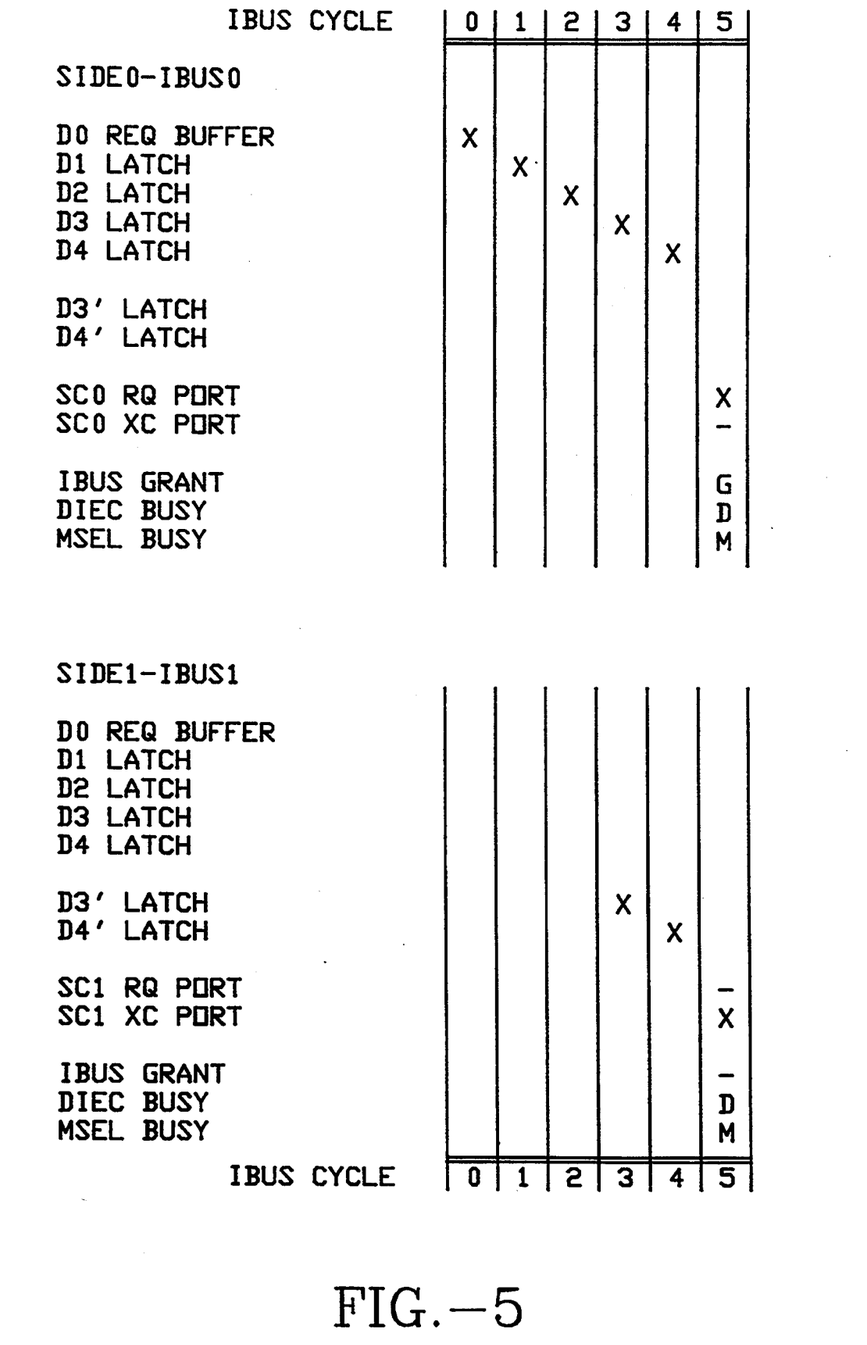
FIG. 5 is a pipeline timing diagram illustrating the cross coupling of system controllers having input structures as shown in FIG. 4.
Figure 6:
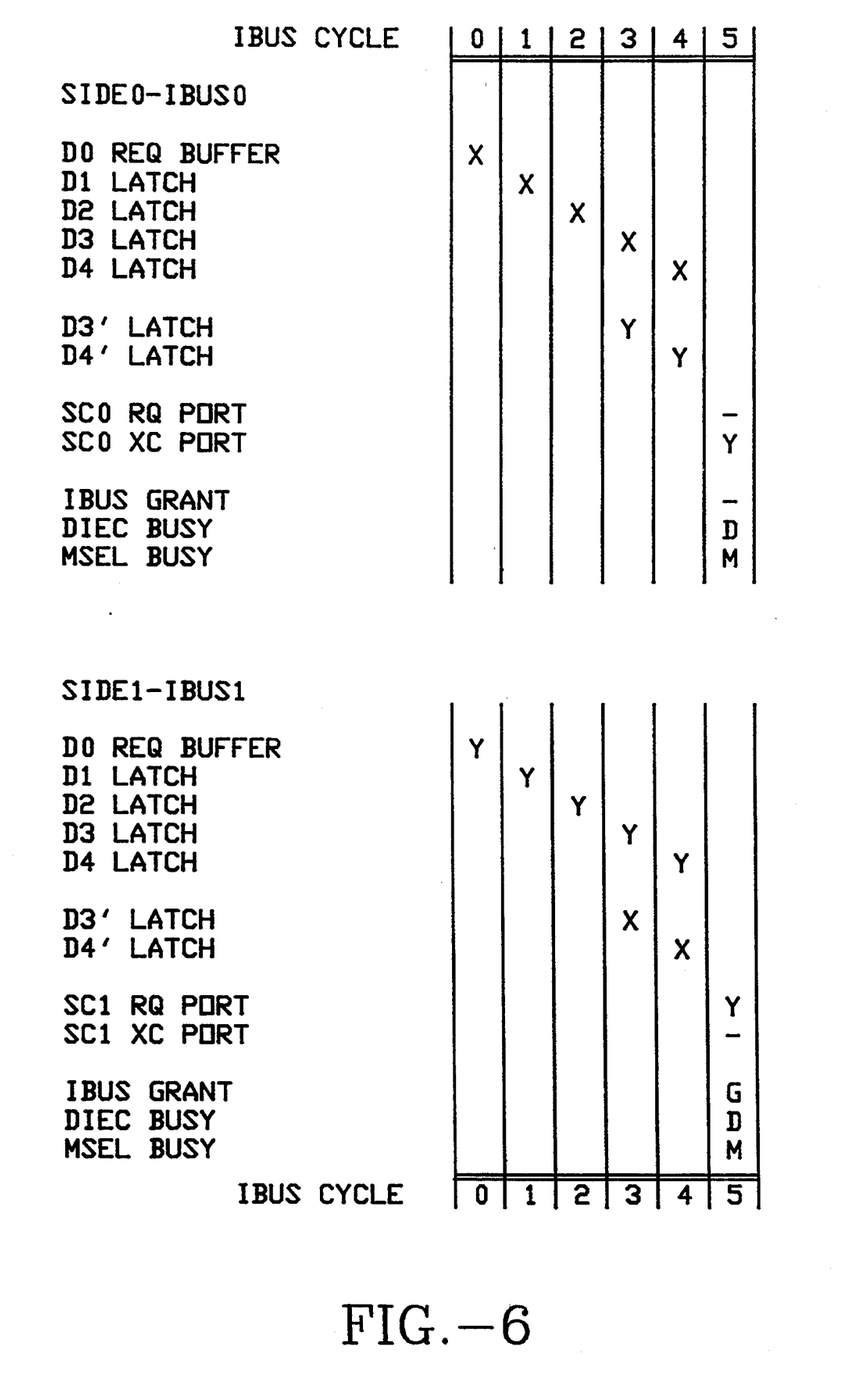
FIG. 6 is a pipeline timing diagram illustrating the arbitration function in the input structure of FIG. 4.

The address selectors 304-307 may select addresses to elements 312-315 of the main storage unit in parallel. This creates the possibility of a collision between requests from the remote system controller SC1 and requests from the local system controller SC0. The system controllers, according to the present invention, include logic for arbitrating between requests to a particular element of a mainstore by the system controllers to prevent such collisions. FIGS. 4-6 illustrate the arbitration mechanism.

SYSTEM CONTROL UNIT INPUT STRUCTURE (FIGS. 4-6)

FIG. 4 illustrates a more detailed implementation of the input structure for the system controller of FIG. 2. The system controller includes a plurality of request buffers for the local CPUs, 401-404, a request buffer 405 for other requestors in the system, and a request buffer 406 for the moveout queue transfer controller 219 of FIG. 2. The outputs of the request buffers are coupled to a priority selector 407. The output of the priority selector is supplied on line 408 to a request swap address buffer array 409 which is coupled to the moveout queue tag interface for CPU cache swap operations. Also, the output on line 408 is coupled through a sequence of registers D1 through D4 to line 419.

Thus, requests from the priority selector 407 are staged through registers D1 through D4 in a pipeline. The output of register D2 is supplied on line 412 to the remote system controller. Requests from the remote system controller are supplied on line 413 through registers D3' and D4'.

The output of register D4 on line 419 is supplied to the request ports and status files 417 which are coupled to the request port server interface as described with reference to FIG. 2, and to local write buffer 418-L and remote write buffer 418-R which are coupled to the mainstore server interface as mentioned with respect to FIG. 2.

The output of register D4' is supplied on line 414 to the cross coupled swap address buffers 415 which are coupled to the moveout queue tag interface. Also, the output of register D4' is coupled to the cross coupled ports 416 and status files which are coupled to the port server interface as described with reference to FIG. 2.

Because of the possibility that mainstore servers 212 on each side of the system will be attempting to fetch or store data to a particular element in the mainstore at the same time, arbitration logic 420 is included. The arbitration logic 420 monitors the request from the local priority selector 407 on line 419, and the request from the remote priority selector on line 414.

The IBUS controller sees requests coming to the system controller from several sources. When a request is selected, it may be loaded into the system controller ports, write buffers, swap address buffers, and/or sent to remote cross coupled ports. Similarly, requests selected into swap address buffers are loaded into the local RQ ports 417 and the cross coupled swap address buffers 416 in the remote system. Moveout queue requests will be sent to either the local or remote write buffer on each side where it will be serviced by the respective mainstore servers. Note that the local and remote write buffers are on the side local to the request in the two sided system. There is no need to cross couple mainstore write requests because each mainstore is dual ported and therefore can be accessed from either side other than for store busy maintenance.

Bottom of queue pointers BOO are maintained for both the local and cross coupled ports. The BOOs point to the next port to be loaded with a request. A BOO port will be loaded if there is a valid request to the ports pending, the port is available, and the port is online.

Individual ports may be taken offline by the service processor in response to certain error conditions or for diagnostics. When a port is offline, the IBUS controller moves to the next port. The only way an IBUS controller will move on to the next port is by loading an available port or skipping a port that is not online. If the next port to be loaded is online and not available, the controller will wait for that port to become available and load it with the next valid request before moving on.

The IBUS controller maintains the DIEC (data integrity equivalence class), mainstore element, and store busies. The mainstore element busies are maintained in order to prevent a request from accessing a mainstore element before that element's resources are available due to a previous access to that same mainstore element. The store busy is used to determine the availability of the mainstore data bus (328—FIG. 3) out of a data in register. The DIEC, mainstore element, and store busies are cross coupled between the two sides in a manner that releases busies in the same cycle on both sides. This cross coupling of busies between the two sides assures that the same request will be accepted into their corresponding port structures on both system controllers, because both system controllers have the same priority logic. This insures both IBUS and port structures in a dual sided system controller will remain coordinated and data integrity will be maintained.

Requests for access to the same main storage element are detected by the arbitration logic 420 which signals the local IBUS busy logic/grant logic 421 and the remote IBUS busy logic/grant logic 422. Arbitration logic 420 operates to select one of the requests. Requestors are conditioned to expect a grant by the presence of busy signals, or not in the cycle after D4. The winning request asserts a grant to its requestor in cycle D5, and the losing request sees a DIEC busy signal and does not issue a grant in cycle D5. In this way, accesses to the same mainstore element by the two system controllers at the same time are prevented.

The timing diagram in FIG. 5 shows the progress of a request through two system controllers referred to as SIDE 0—IBUS 0 and SIDE 1—IBUS 1. In this example, there is only one valid request in the two IBUSes. It can be seen from the diagram that the local request on SIDE 0 is selected by the priority selector 407 in cycle 0 out of the request buffer. The request cycles through delay latches D1 in cycle 1, D2 in cycle 2, D3 in cycle 3, and D4 in cycle 4. In cycle 5, the request is latched into the local request port 417 (SC0 RQ Port).

The request appears in latch D3' of the remote system controller SIDE 1, during the third cycle and is staged to latch D4' in the fourth cycle. In the fifth cycle, it is latched in the cross coupled port 416 (SC1 XC Port).

The IBUS grant logic is asserted in cycle 5 as illustrated. Thus, for a system in which the request on SIDE 0 is granted, IBUS grant G is asserted in cycle 5. The busy signal (MSEL busy) for the mainstore element subject of the request is asserted on both sides. Also, in the Amdahl 5995-M, the arbitrator 420 also detects simultaneous access to data integrity equivalence classes under a similar scheme. Thus, DIEC busy is asserted on both sides in cycle 5. Thus, it can be seen that the grant and busy signals are asserted on both sides during the same cycle.

The timing for a collision is illustrated in FIG. 6. In FIG. 6, two fetch requests colliding in the D4 selection latches are detected. Priority selection between the local request X and remote request Y occurs when these two requests contend for the same system controller resource. The timing diagram in FIG. 6 shows the progress of each request through the two system controllers termed SIDE 0 and SIDE 1. Thus, if both requests X and Y are trying to access the same mainstore element, the arbitration logic will assign higher priority to one of the requests. In the example, request Y eventually wins the selection process. Thus, it can be seen that request X proceeds on SIDE 0 through the request buffer in cycle 0, the delay latches D1 through D4 in cycles 1-4. Request Y proceeds through SIDE 1 in the request buffer in cycle 0, and delay latches D1 through D4 in cycles 1-4. On SIDE 0, the request Y appears in latches D3' and D4' in cycles 3 and 4. Similarly, request X appears on SIDE 1 in latches D3' and D4' during cycles 3 and 4. Request Y wins arbitration, so in cycle 5, it is selected into the cross coupled port 416 on SIDE 0. Request X is suppressed. The IBUS grant signal on SIDE 0 is not asserted, and the busy signals for the mainstore element (MSEL busy) and the data integrity class (DIEC busy) are asserted on both sides.

On SIDE 1, request Y also wins the arbitration and is selected into the local request port corresponding to port 417 of FIG. 4. The IBUS grant signal is asserted on SIDE 1, as are the busy signals D and M in cycle 5. Request X is suppressed.

Thus, the IBUS performs several functions, including priority selection, busy analysis, management of the request staging and holding, and the loading of the system controller ports. The validity, type, and source of a request in each request buffer is combined with an availability of system controller related resources for the purpose of making a priority selection in selector 407. The D1, D2, D3, and D4 latches are needed to perform cross coupling of requests. The IBUS controller stages requests for four cycles to allow time for the delay required to cross couple the request between the two systems. In a dual sided system, the remote request data has its own data path that provides a remote request data to the cross coupled ports 416 and to the cross coupled swap address buffers 415. The local request and cross coupled port structures 417 and 416 are locally independent of one another and have separate data paths. Thus, it is possible to select both a local and a remote request into the request ports and cross coupled ports respectively, in the same cycle. A long move-out request, solicited by the move out server, sends information directly to the local swap buffers 409 and also passes it through latches D1, D2, and remote system controllers D3' and D4' to provide a path to the remote cross coupled swap address buffers 415. Further, there is a priority selection that may occur between the local and remote requests if those requests are in contention for a system controller resource such as a mainstore element or a data integrity equivalence class. If contentions occur between the local and remote requests, the highest priority request will be selected. In the case of a tie in priority, a tie breaker bit matrix indicating which requestor won the last time those two contended, is factored into the prioritization selection process in a manner that selects the loser of the last tie. The tie breaker bit is updated to indicate the winner of the last tie only after a tie winning request has been selected.

CONCLUSION

Accordingly, the present invention provides a large scale computing complex having a plurality of system controllers which can be partitioned without affecting the availability of mainstore to non-isolated parts of the system. This provides a significant advantage in performance of large scale computing systems not achieved in the prior art.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A data processing system comprising:
    a first mainstore having a first local port serving requests for access to the first mainstore and a first remote port serving requests for access to the first mainstore;
    a second mainstore having a local second port serving requests for access to the second mainstore and a remote port serving requests for access to the second mainstore;
    a first set of computing resources which generate requests for access to data in the first and second mainstores, said first set of computing resources includes a first cache memory system;
    a second set of computing resources which generate requests for access to data in the first and second mainstores, said second set of computing resources includes a second cache memory system;
    a first system controller including
        a first input means, coupled to the first set of computing resources and to a second system controller, for receiving requests for access to data in the first and second mainstores from the first set of computing resources and for receiving requests for access to data in the first and second mainstores received from said second set of computing resources by said second system controller,
        a first server means, coupled to the first input means, to the first local port serving request on the first mainstore and to the second remote port serving request on the second mainstore, for serving requests issued by said first set of computing resources to access the first and second mainstores from the first input means and to monitor the requests issued by said second set of computing resources for insuring that the data to be accessed by the request from the first set of data resources is not presently being accessed by a second server means; and
        a first data integrity means for maintaining information about request for access issued by said first set of computing resources in the first cache memory system in the first set computing resources which is used for insuring system data integrity and for retrieving the information from the first cache memory system in response to request for access from the first set of computing resources and from the second system controller;
    the second system controller including
        second input means, coupled to the second set of computing resources and the first system controller, for receiving requests for access to data in the first and second mainstores from the second set of computing resources and for receiving requests for access to data in the first and second mainstores received from said first set of computing resources by said first system controller,
        second server means, coupled to the second input means, to the second local port request on the second mainstore and to the first remote port serving requests on the first mainstore, for serving requests issued by said second set of computing resources to access the first and second mainstores from the second input means and to monitor the requests issued by said first set of computing resources for insuring that data to be accessed by the request from the second set of data resources is not presently being accessed by the first server means; and
        a second data integrity means for maintaining information about request for access issued by second set of computing resources in the second cache memory system in the second set computing resources which is used for insuring system data integrity and for retrieving the information from the second cache memory system in response to requests for access from the second set of computing resources and from the first system controller;

said first and second controllers cooperating with each other to preserve data integrity; and partitioning means, coupled to the first and second system controllers, for partitioning the data processing system so as to isolate the first system controller and first set of computing resources from the second system controller and the second set of computing resources.

2. The system of claim 1 wherein the first and second server means both further includes a logic means to prevent collisions of accesses through the first and second system controllers to particular locations in the first and second mainstores.

3. The system of claim 2, wherein the first and second mitstotes include respective pluralities of elements to be accessed parallel, and the first and second input means include means for preventing collisions between separate accesses to particular elements of the first and second mainstores.

4. The system of claim 1, wherein the partitioning means includes disabling means for disabling the first system controller and the second system controller.

5. The system of claim 4, wherein the disabling means for disabling either the first system controller or the second system controller allows the first system controller or the second system controller that as not disabled to retains access to the first and second mainstores.

6. The system of claim 1, wherein the first system controller includes means coupled with the first input means for transferring requests for access from the first set of computing resources to the second input means for service by the second data integrity means, and the second system controller includes means coupled with the second input means for transferring requests for access from the second set of computing resources to the first input means for service by the first data integrity means.

7. The data processing system of claim 1 wherein:
the first system controller is connected to the first local port serving requests on the first mainstore and to the second remote port serving requests on the second mainstore for processing request from the first set of computing resources for access to the first and second mainstores; and
the second system controller is connected to the second local port serving request on the second mainstore and to the first remote port serving requests on the first mainstore for processing request from the second set of computing resources for access to the first and second mainstores.

* * * * *

UNITED STATES PATENT AND TRADEMARK OFFICE
CERTIFICATE OF CORRECTION

PATENT NO. : 5,367,701
DATED : November 22, 1994
INVENTOR(S) : Mark von Gnechten et al.

It is certified that error appears in the above-indentified patent and that said Letters Patent is hereby corrected as shown below:

Column 10, line 3, before "remote" insert --second--;

Column 10, line 54, after "port" insert --serving--;

Column 10, line 66, after "by" insert --said--;

Column 11, line 22, "mitstotes" should be --mainstores--;

Column 11, line 23, after "accessed" insert --in--.

Signed and Sealed this

Second Day of July, 1996

Attest:

BRUCE LEHMAN

Attesting Officer

Commissioner of Patents and Trademarks